(12) United States Patent
Saxler (10) Patent No.: US 7,544,963 B2
(45) Date of Patent: Jun. 9, 2009

(54) BINARY GROUP III-NITRIDE BASED HIGH ELECTRON MOBILITY TRANSISTORS

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 463 days.

(21) Appl. No.: 11/118,675

(22) Filed: Apr. 29, 2005

(65) Prior Publication Data

US 2006/0244011 A1    Nov. 2, 2006

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. .............. 257/20; 257/24; 257/194
(58) Field of Classification Search .................. 257/20, 257/24, 27, 190, 194
See application file for complete search history.

(56) References Cited

U.S. PATENT DOCUMENTS

| | | | |
|---|---|---|---|
| 4,424,525 A | 1/1984 | Mimura | |
| 4,471,366 A | 9/1984 | Delagebeaudeuf et al. | |
| 4,727,403 A | 2/1988 | Hida et al. | |
| 4,755,867 A | 7/1988 | Cheng | |
| 4,788,156 A | 11/1988 | Stoneham et al. | |
| 4,946,547 A | 8/1990 | Palmour et al. | |
| 5,053,348 A | 10/1991 | Mishra et al. | |
| 5,172,197 A | 12/1992 | Nguyen et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,296,395 A | 3/1994 | Khan et al. | |
| 5,298,445 A | 3/1994 | Asano | |
| RE34,861 E | 2/1995 | Davis et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,534,462 A | 7/1996 | Fiordalice et al. | |
| 5,592,501 A | 1/1997 | Edmond et al. | |

(Continued)

FOREIGN PATENT DOCUMENTS

EP    0 334 006 A1    9/1989

(Continued)

OTHER PUBLICATIONS

Brandes, George R., Declaration of Dr. George R. Brandes under 37 CFR § 1.56, Apr. 21, 2006.

(Continued)

*Primary Examiner*—Thien F Tran
(74) *Attorney, Agent, or Firm*—Myers Bigel Sibley & Sajovec (57) ABSTRACT

Binary Group III-nitride high electron mobility transistors (HEMTs) and methods of fabricating binary Group III-nitride HEMTs are provided. In some embodiments, the binary Group III-nitride HEMTs include a first binary Group III-nitride barrier layer, a binary Group III-nitride channel layer on the first barrier layer; and a second binary Group III-nitride barrier layer on the channel layer. In some embodiments, the binary Group III-nitride HEMTs include a first AlN barrier layer, a GaN channel layer and a second AlN barrier layer.

34 Claims, 6 Drawing Sheets

U.S. PATENT DOCUMENTS

| | | | |
|---|---|---|---|
| 5,686,737 | A | 11/1997 | Allen |
| 5,700,714 | A | 12/1997 | Ogihara et al. |
| 5,701,019 | A | 12/1997 | Matsumoto et al. |
| 5,705,827 | A | 1/1998 | Baba et al. |
| 5,804,482 | A | 9/1998 | Konstantinov et al. |
| 5,885,860 | A | 3/1999 | Weitzel et al. |
| 5,946,547 | A | 8/1999 | Kim et al. |
| 5,990,531 | A | 11/1999 | Taskar et al. |
| 6,028,328 | A | 2/2000 | Riechert et al. |
| 6,046,464 | A | 4/2000 | Schetzina |
| 6,051,849 | A | 4/2000 | Davis et al. |
| 6,064,082 | A | 5/2000 | Kawai et al. |
| 6,086,673 | A | 7/2000 | Molnar |
| 6,150,680 | A | 11/2000 | Eastman et al. |
| 6,177,685 | B1 | 1/2001 | Teraguchi et al. |
| 6,177,688 | B1 | 1/2001 | Linthicum et al. |
| 6,218,680 | B1 | 4/2001 | Carter, Jr. et al. |
| 6,255,198 | B1 | 7/2001 | Linthicum et al. |
| 6,261,929 | B1 | 7/2001 | Gehrke et al. |
| 6,316,793 | B1 | 11/2001 | Sheppard et al. |
| 6,376,339 | B2 | 4/2002 | Linthicum et al. |
| 6,380,108 | B1 | 4/2002 | Linthicum et al. |
| 6,429,467 | B1 | 8/2002 | Ando |
| 6,448,648 | B1 | 9/2002 | Boos |
| 6,462,355 | B1 | 10/2002 | Linthicum et al. |
| 6,486,042 | B2 | 11/2002 | Gehrke et al. |
| 6,489,221 | B2 | 12/2002 | Gehrke et al. |
| 6,492,669 | B2 | 12/2002 | Nakayama et al. |
| 6,515,316 | B1 | 2/2003 | Wojtowicz et al. |
| 6,521,514 | B1 | 2/2003 | Gehrke et al. |
| 6,545,300 | B2 | 4/2003 | Gehrke et al. |
| 6,548,333 | B2 | 4/2003 | Smith |
| 6,570,192 | B1 | 5/2003 | Davis et al. |
| 6,582,906 | B1 | 6/2003 | Cao et al. |
| 6,582,986 | B2 | 6/2003 | Kong et al. |
| 6,586,778 | B2 | 7/2003 | Linthicum et al. |
| 6,586,781 | B2 | 7/2003 | Wu et al. |
| 6,602,763 | B2 | 8/2003 | Davis et al. |
| 6,602,764 | B2 | 8/2003 | Linthicum et al. |
| 6,608,327 | B1 | 8/2003 | Davis et al. |
| 6,621,148 | B2 | 9/2003 | Linthicum et al. |
| 6,639,255 | B2 | 10/2003 | Inoue et al. |
| 6,686,261 | B2 | 2/2004 | Gehrke et al. |
| 6,706,114 | B2 | 3/2004 | Mueller |
| 6,841,001 | B2 | 1/2005 | Saxler |
| 6,849,882 | B2 | 2/2005 | Chavarkar et al. |
| 7,170,095 | B2 | 1/2007 | Vaudo et al. |
| 2001/0015446 | A1 | 8/2001 | Inoue et al. |
| 2001/0020700 | A1 | 9/2001 | Inoue et al. |
| 2001/0023964 | A1 | 9/2001 | Wu et al. |
| 2001/0040246 | A1 | 11/2001 | Ishii |
| 2002/0008241 | A1 | 1/2002 | Edmond et al. |
| 2002/0017696 | A1 | 2/2002 | Nakayama et al. |
| 2002/0066908 | A1 | 6/2002 | Smith |
| 2002/0079508 | A1 | 6/2002 | Yoshida |
| 2002/0119610 | A1 | 8/2002 | Nishii et al. |
| 2002/0167023 | A1 | 11/2002 | Charvarkar et al. |
| 2003/0017683 | A1 | 1/2003 | Emrick et al. |
| 2003/0020092 | A1 | 1/2003 | Parikh et al. |
| 2003/0102482 | A1 | 6/2003 | Saxler |
| 2003/0123829 | A1 | 7/2003 | Taylor |
| 2003/0145784 | A1 | 8/2003 | Thompson et al. |
| 2003/0157776 | A1 | 8/2003 | Smith |
| 2003/0213975 | A1 | 11/2003 | Hirose et al. |
| 2004/0004223 | A1 | 1/2004 | Nagahama et al. |
| 2004/0021152 | A1 | 2/2004 | Nguyen et al. |
| 2004/0029330 | A1 | 2/2004 | Hussain et al. |
| 2004/0061129 | A1 | 4/2004 | Saxler et al. |
| 2004/0124435 | A1 | 7/2004 | D'Evelyn et al. |
| 2004/0241970 | A1 | 12/2004 | Ring |
| 2005/0077541 | A1 | 4/2005 | Shen et al. |
| 2006/0231862 | A1* | 10/2006 | Otsuka et al. ............... 257/197 |
| 2006/0244011 | A1 | 11/2006 | Saxler |

FOREIGN PATENT DOCUMENTS

| | | | |
|---|---|---|---|
| EP | 0 563 847 | A2 | 10/1993 |
| JP | 10-050982 | | 2/1998 |
| JP | 11261053 | | 9/1999 |
| JP | 2001230407 | A | 8/2001 |
| JP | 2002016087 | A | 1/2002 |
| JP | 2004-342810 | | 12/2004 |
| WO | WO 93/23877 | A1 | 11/1993 |
| WO | WO 01/57929 | A1 | 8/2001 |
| WO | WO 03/049193 | A1 | 6/2003 |
| WO | WO 2004/008495 | | 1/2004 |

OTHER PUBLICATIONS

International Search Report and Written Opinion of the International Searching Authority for International application No. PCT/US2006/009257, mailed Jul. 18, 2006.

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

Ando et al., "10-W/mm AlGaN-GaN HFET With a Field Modulating Plate," *IEEE Electron Device Letters*, 24(5), pp. 289-291 (May 2003).

Beaumont, B. et al., "Epitaxial Lateral Overgrowth of GaN," *Phys. Stat. Sol.* (b) 227, No. 1, pp. 1-43 (2001).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Burm et al. "Recessed Gate GaN MODFETS," *Solid-State Electronics*. vol. 41, No. 2, pp. 247-250 (1997).

Burm et al. "Ultra-Low Resistive Ohmic Contacts on $n$-GaN Using Si Implantation, " *Applied Physics Letters*. vol. 70, No. 4, 464-66 (1997), Chen et al. "Cl2 reactive ion etching for gate recessing of AlGaN/GaN field-effect transistors," *J. Vac. Sci. Technol. B*. vol. 17, No. 6, pp. 2755-2758 (1999).

Eastman et al. "Undoped AlGaN/GaN HEMTs for Microwave Power Amplification," *IEEE Transactions on Electron Devices*. vol. 48, No. 3, pp. 479-485 (Mar. 2001).

Egawa et al. "Recessed gate AlGaN/GaN MODFET on Sapphire Grown by MOCVD," *Applied Physics Letters*. vol. 76, No. 1, pp. 121-123 (Jan. 2000).

Gaska et al. "Electron Transport in AlGaN/GaN Heterostructures Grown on 6H-SiC Substrates," *Applied Physics Letters*. vol. 72, No. 6, pp. 707-709 (Feb. 1998).

Gaska et al. "High-Temperature Performance of AlGaN/GaN HFET's on SiC Substrates," *IEEE Electron Device Letters*. vol. 18, No. 1, pp. 492-494 (Oct. 1997).

Heikman, Sten J., *MOCVD Growth Technologies for Applications in AlGaN/GaN High Electron Mobility Transistors*, Dissertation, University of California—Santa Barbara, Sep. 2002, 190 pages.

Hikita et al., "350V/150A AlGaN/GaN Power HFET on Silicon Substrate With Source-via Grouding (SVG) Structure," *Electron Devices Meeting, 2004*, pp. 803-806, IEDM Technical Digest. IEEE International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting, 2004*, pp. 799-802, IEDM Technical Digest. IEEE International (Dec. 2004).

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Parikh et al., "Development of Gallium Nitride Epitaxy and Associated Material-Device Correlation for RF, Microwave and MM-wave Applications," Cree, Inc. (35 slides).

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum*. vols. 338-342, pp. 1643-1646, (2000).

Shen et al., "High-Power Polarization-Engineered GaN/AlGaN/GaN HEMTs Without Surface Passivation," *IEEE Electronics Device Letters*. vol. 25, No. 1, pp. 7-9 (2004).

Shiojima et al., "Improved Carrier Confinement by a Buried p-Layer in the AlGaN/GaN HEMT Structure," *IEICE Trans. Electron.*, E83-C(12), (Dec. 2000).

Sriram et al. "RF Performance of AlGaN/GaN MODFET's on High Resistivity SiC Substrates," Presentation at Materials Research Society Fall Symposium, 1997.

"Thick AlN template on SiC substrate—Novel semi insulating substrate for GaN-based devices," © 2003 by TDI, Inc., http://www.tdii.com/products/AlN_SiCt.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Improved Dielectric Passivation for Semiconductor Devices," U.S. Appl. No. 10/851,507, filed May 22, 2004 (Cree Docket No. P0274).

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Co-Doping for Fermi Level Control in Semi-Insulating Group III Nitrides," U.S. Appl. No. 10/752,970, filed Jan. 7, 2004.

United States Patent Application entitled "Cap Layers and/or Passivation Layers for Nitride-Based Transistors, Transistor Structures and Methods of Fabricating the Same," U.S. Appl. No. 10/996,249, filed Nov. 23, 2004.

United States Patent Application entitled "Methods of Having Laterally Grown Active Region and Methods of Fabricating Same," U.S. Appl. No. 10/899,215, filed Jul. 26, 2004.

United States Patent Application entitled "Silicon Carbide on Diamond Substrates and Related Devices and Methods," U.S. Appl. No. 10/707,898, filed Jan. 22, 2004.

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "Semiconductor Devices Having A Hybrid Channel Layer Current Aperture Transistors and Methods of Fabricating Same" U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Composite Substrates of Conductive And Insulating or Semi-Insulating Group III-Nitrides For Group III-Nitride Devices," U.S. Appl. No. 11/103,127, filed Apr. 11, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc.

Wu et al., "3.5-Watt AlGaN/GaN HEMTs and Amplifiers at 35 GHz," Cree Santa Barbara Technology Center, Goleta, CA 93117.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al. "High Al-Content AlGaN/GaN MODFET's for Ultrahigh Performance," *IEEE Electron Device Letters*. vol. 19, No. 2, pp. 50-53 (Feb. 1998).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117.

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

Asbeck et al. "Piezoelectric charge densities in AlGaN/GaN HFETs," *Elecronics Letters*. vol. 33, No. 14, pp. 1230-1231 (1997).

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys*. 33:775-778 (1994).

Coffie et al., Unpassivated p-GaN/AlGaN/GaN HEMTs with 7.1 W/MMF at 10 GHz, *Electronic Letters online* No. 20030872, 39(19), (Sep. 18, 2003).

Eastman et al. "GaN materials for high power microwave amplifiers," *Mat. Res. Soc. Symp. Proc.* vol. 512 (1998).

Gaska et al., "Self-Heating in High-Power AlGaN/GaN HFET's ," *IEEE Electron Device Letters*, 19(3), pp. 89-91 (Mar. 1998).

Gelmont et al. "Monte Carlo simulation of electron transport in gallium nitride," *Journal of Applied Physics*. vol. 74, No. 3, pp. 1818-1821 (Aug. 1993).

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, et al., "Mass Transport Regrowth of GaN for Ohmic Contacts to AlGaN/GaN," *Applied Physics Letters*. vol. 78, No. 19, pp. 2876.

Heikman et al. "Polarization Effects in AlGaN/GaN and GaN/AlGaN/GaN heterostructures," *Journal of Applied Physics*. vol. 93, No. 12, pp. 10114-10118 (Jun. 2003).

Karmalkar et al. "Resurf AlGaN/GaN HEMT for High Voltage Power Switching," *IEEE Electron Device Letters*. vol. 22, No. 8, pp. 373-375 (Aug. 2001).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kasahara et al., "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters et al., "Double-Heterojunction Lattice-Matched and Pseudomorphic InGaAs HEMT with δ- Doped InP Supply Layers and p-InP Barier Enhancement Layer Grown by LP-MOVPE," *IEEE Electron Device Letters*, 14(1), (Jan. 1993).

Kuzmik et al. "Annealing of Schottky contacts deposited on dry etched AlGaN/Gan," *Semiconductor Science and Technology*. vol. 17, No. 11 (Nov. 2002).

Manfra et al., "Electron Mobility Exceeding 160 000 $cm^2$/V s in AlGaN/GaN Heterostructures Grown by Molecular-beam Epitaxy," *Applied Physics Letters*, 85(22), pp. 5394-5396 (Nov. 29, 2004).

Neuburger et al. "Design of GaN-based Field Effect Transistor Structures based on Doping Screening of Polarization Fields," WA 1.5, 7th Wide-Gandgap III-Nitride Workshop (Mar. 2002).

Ping et al. "DC and Microwave Performance of High-Current AlGaN/GaN Heterostructure Field Effect Transistors Grown on p-Type SiC Substrates," *IEEE Electron Device Letters*. vol. 19, No. 2, pp. 54-56 (Feb. 1998).

Sriram et al. "SiC and GaN Wide Bandgap Microwave Power Transistors," *IEEE Sarnoff Symposium*, Pittsburgh, PA, Mar. 18, 1998.

\* cited by examiner

Figure 5

BINARY GROUP III-NITRIDE BASED HIGH ELECTRON MOBILITY TRANSISTORS

FIELD OF THE INVENTION

The present invention relates to semiconductor devices and, more particularly, to transistors that incorporate nitride-based active layers.

BACKGROUND

Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

SUMMARY OF THE INVENTION

Some embodiments of the present invention provide high electron mobility transistors (HEMTs) and methods of fabricating HEMTs that include a first binary Group III-nitride barrier layer, a binary Group III-nitride channel layer on the first barrier layer; and a second binary Group 111-nitride barrier layer on the channel layer. In some embodiments, the first barrier layer comprises a doped binary Group III-nitride region adjacent the binary Group III-nitride channel layer. An undoped binary Group III-nitride layer may also be disposed between the doped binary Group III-nitride region and the channel layer.

In further embodiments of the present invention, the second barrier layer comprises a first doped binary Group III-nitride region adjacent the binary Group III-nitride channel layer. An undoped binary Group III-nitride layer may be disposed between the first doped binary Group III-nitride region of the second barrier layer and the channel layer.

In some embodiments of the present invention, the first barrier layer comprises an AlN layer, the channel layer comprises a GaN layer and the second barrier layer comprises an AlN layer. The first barrier layer may have a thickness of from about 1 nm to about 1 mm, the channel layer may have a thickness of from about 0.3 nm to about 10 nm and the second barrier layer may have a thickness of from about 0.5 nm to about 50 nm.

In additional embodiments of the present invention, a first doped AlN layer is disposed between the first AlN barrier layer and the GaN channel layer. The first doped AlN layer may comprise a Si, Ge and/or Sn doped AlN layer. The first doped AlN layer may have a thickness of from about 0.2 nm to about 10 nm. The first doped AlN layer may have a dopant concentration of from about $1\times10^{17}$ cm$^{-3}$ to about $1\times10^{21}$ cm$^{-3}$. A first undoped AlN layer may also be disposed between the first doped AlN layer and the GaN channel layer. The first undoped AlN layer may have a thickness of from about 0.3 nm to about 5 nm.

In further embodiments, a second doped AlN layer is disposed between the second AlN barrier layer and the GaN channel layer. The second doped AlN layer may comprise a Si, Ge and/or Sn doped AlN layer. The second doped AlN layer may have a thickness of from about 0.2 nm to about 10 nm. The second doped AlN layer may have a dopant concentration of from about $1\times10^{17}$ cm$^{-3}$ to about $1\times10^{21}$ cm$^{-3}$. A second undoped AlN layer may be disposed between the second doped AlN layer and the GaN channel layer. The second undoped AlN layer may have a thickness of from about 0.3 nm to about 5 nm.

In still further embodiments of the present invention, a GaN layer is provided on the second AlN barrier layer opposite the GaN channel layer. The GaN layer on the second AlN barrier layer opposite the GaN channel layer may have a thickness of from about 0.3 nm to about 100 nm and, in some embodiments, less than about 10 nm.

In some embodiments of the present invention, the first binary Group III-nitride barrier layer comprises AlN, the binary Group III-nitride channel layer on the first barrier layer comprises InN and the second binary Group III-nitride barrier layer on the channel layer comprises AlN. In other embodiments of the present invention, the first binary Group III-nitride barrier layer comprises GaN, the binary Group III-nitride channel layer on the first barrier layer comprises InN and the second binary Group III-nitride barrier layer on the channel layer comprises GaN. In still further embodiments of the present invention, the first binary Group III-nitride barrier layer comprises GaN, the binary Group III-nitride channel layer on the first barrier layer comprises InN and the second binary Group III-nitride barrier layer on the channel layer comprises AlN. In additional embodiments of the present invention, the first binary Group III-nitride barrier layer comprises AlN, the binary Group III-nitride channel layer on the first barrier layer comprises InN and the second binary Group III-nitride barrier layer on the channel layer comprises GaN.

In some embodiments of the present invention, the HEMT does not include a ternary or quaternary Group III-nitride layer in an active region of the HEMT.

DETAILED DESCRIPTION OF EMBODIMENTS OF THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the present invention provide binary nitride-based HEMTs such as Group III-nitride based devices. Binary Group III-nitride devices according to some embodiments of the present invention may have reduced or minimal alloy scattering as all of the layers of the active region of the device are binary Group III-nitrides. As used herein, the term "Group III nitride" refers to those semiconducting compounds formed between nitrogen and the elements in Group III of the periodic table, gallium (Ga), aluminum (Al) and/or indium (In). As is well understood by those in this art, the Group III elements can combine with nitrogen to form binary (e.g., GaN), ternary (e.g., InGaN), and quaternary compounds (AlInGaN). These compounds all have empirical formulas in which one mole of nitrogen is combined with a total of one mole of the Group III elements. Accordingly, formulas such as $In_xGa_{1-x}N$ where $0 \leq x \leq 1$ are often used to describe them.

Furthermore, as used herein, binary Group III nitrides refers to nitrogen and one of the Group III elements and the absence of other Group III elements intentionally incorporated into active layers of the Group III-nitride based device. In some embodiments of the present invention, a binary Group III-nitride compound has up to about 1% of a second Group III element without causing significant alloy scattering. For example, indium may be present in small amounts if it is used as a surfactant during growth of AlN or GaN. Accordingly, as will be understood by those of skill in the art in light of the present disclosure, references to binary Group III-nitride layers or regions includes non-ideal compounds. For example, an active layer of a device may be binary even if some of a third Group III element is present in the active layer, for example, through unintentional incorporation by contamination during fabrication. Active layers of a device are the layers of the device where the 2DEG is formed and layers disposed between the layers where the 2DEG is formed and the source, drain and/or gate contacts and/or contact layers (i.e. layers on which a contact is directly formed) of the device. Dopants, such as silicon may be incorporated in the layers that form the 2DEG while still providing binary Group III-nitride structures. In some embodiments of the present invention, non-Group III-nitride materials or ternary or quaternary compounds may be in layers between the layers that form the 2DEG and a substrate and/or in the substrate. For example, the substrate may be sapphire or SiC or graded transition layers may include AlGaN.

Figure 1:
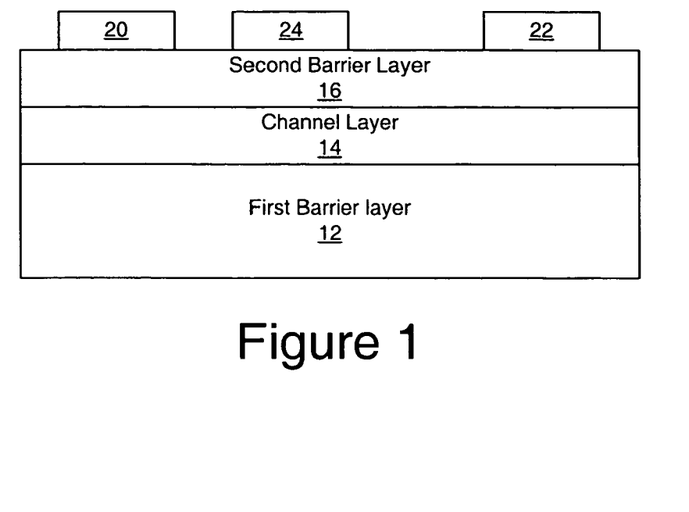
FIG. 1 is a cross-section of a binary Group III-nitride based HEMT according to some embodiments of the present invention.

FIG. 1 illustrates a HEMT structure according to some embodiments of the present invention. As seen in FIG. 1, a binary Group III-nitride channel layer 14, such as GaN, is provided on a first binary Group III-nitride barrier layer 12. A second binary Group III-nitride barrier layer 16 is provided on the channel layer 14. The first barrier layer 12 and the second barrier layer 16 may be, for example, AlN and may be undoped or include doped regions adjacent the channel layer 14.

Furthermore, the first barrier layer 12, channel layer 14 and the second barrier layer 16 may be deposited and/or grown by MOCVD or by other techniques known to those of skill in the art, such as MBE or HVPE. Techniques for fabricating AlN substrates, AlN layers, GaN layers and other binary Group III-nitride layers are known to those of skill in the art and need not be described further herein.

In particular embodiments of the present invention, the first barrier layer 12 may be provided as a substrate, such as an AlN substrate. Alternatively, the structure of FIG. 1 may be formed on a substrate. For example, the first barrier layer 12 may be provided by an AlN buffer layer on an AlN substrate. The AlN buffer layer may provide higher purity and/or quality AlN than is provided by the AlN substrate. Furthermore, use of an AlN substrate may eliminate a thermal barrier at the interface between the first barrier layer 12 and the substrate and AlN homoepitaxially grown on an AlN substrate may have a lower dislocation density that AlN grown heteroepitaxially. Suitable AlN substrates for use as the first barrier layer 12 or on which an AlN buffer layer may be provided as the first barrier layer 12 are available, for example, from Crystal IS, Inc. of Watervliet, N.Y.

Although AlN may be used as a substrate material, in which case the first barrier layer 12 may be provided by the substrate, embodiments of the present invention may utilize any suitable substrate, such as sapphire, silicon carbide, aluminum gallium nitride, gallium nitride, silicon, GaAs, LGO, ZnO, LAO, InP and the like. In some embodiments, an appropriate buffer layer also may be formed. For example, a nucleation layer and/or epitaxial lateral overgrowth (ELO) growth may be used in growing the binary Group III-nitride layers on a substrate such as silicon carbide or sapphire. Furthermore, growth conditions may be controlled to control the dislocation density and/or strain of the Group III-nitride layers so as to provide substantially relaxed layers.

The first barrier layer 12 may be an undoped or unintentionally doped binary Group III nitride, such as AlN. In some embodiments, the first barrier layer 12 may include a thick semi-insulating or insulating layer with an undoped, unintentionally and/or doped region adjacent the channel layer 14. For example, in some embodiments of the present invention, the first barrier layer 12 may be from about 1 nm to about 1 mm thick AlN. In some embodiments of the present invention, the first barrier layer 12 is about 1 µm thick.

In some embodiments of the present invention, the channel layer 14 is a binary Group III-nitride, such as GaN or InN, provided that the energy of the conduction band edge of the channel layer 14 is less than the energy of the conduction band edge of the second barrier layer 16 at the interface between the channel and second barrier layer. In particular, the channel layer 14 may have a bandgap that is less than the bandgap of the second barrier layer 16 and the channel layer 14 may also have a larger electron affinity than the second barrier layer 16. The channel layer 14 may be undoped or unintentionally doped and may be grown to a thickness of from about 3 to about 100 Å. For example, in some embodiments, the channel layer 14 may have a thickness of less than about 4 nm. The channel layer 14 should be sufficiently thin so that a two-dimensional hole gas does not form at the junction with the first barrier layer 12 and so that the channel layer 14 remains coherently strained.

In particular embodiments of the present invention, the second barrier layer 16 is thick enough and/or has a high enough doping to induce a significant carrier concentration at the interface between the channel layer 14 and the second barrier layer 16. As discussed above, the second barrier layer 16 may be a binary Group III-nitride, such as AlN, and has a bandgap larger than that of the channel layer 14 and a smaller electron affinity than the channel layer 14. The second barrier layer 16 may, for example, be from about 0.5 nm to about 50 nm thick, but is not so thick as to cause cracking or substantial defect formation therein. The second barrier layer 16 may be thicker than 50 nm if contact recesses are utilized. In certain embodiments of the present invention, the second barrier layer 16 is undoped or unintentionally doped.

Source and drain ohmic contacts 20 and 22 are provided on the second barrier layer 16 and a gate contact 24 is disposed between the source and drain contacts 20 and 22. Suitable ohmic contact materials may include, for example, Ti, Al, Ni, and/or Au. A very high anneal temperature may be used or a thin second barrier layer 16 may be used to provide a good ohmic contact. Furthermore, ion implantation (e.g., Si) and annealing and/or contact recesses may also be used to improve the quality of the ohmic contacts. Suitable gate materials may depend on the composition of the cap layer, however, in certain embodiments, conventional materials capable of making a Schottky contact to a nitride based semiconductor material may be used, such as Ni, Pt, NiSi$_x$, Cu, Pd, Cr, W and/or WSiN.

Embodiments of the present invention have been described above with reference to a binary Group III-nitride first barrier layer, a binary Group III-nitride channel layer and a binary Group III-nitride second barrier layer. In some embodiments of the present invention, the transistors have a GaN channel layer. For example, in FIG. 2A a GaN channel layer is provided between AlN layers, thus providing an AlN/GaN/AlN structure. In other embodiments of the present invention, an InN channel layer may be provided. Thus, for example, structures such as an AlN/InN/AlN, a GaN/InN/GaN, a GaN/InN/AlN or an AlN/InN/GaN structure may be provided while still being within the scope of some embodiments of the present invention. AlN/InN/GaN structures may be strain balanced if thicknesses of the layers are properly chosen and may have a very large 2DEG comparable to AlN/GaN structures.

Figure 2A:
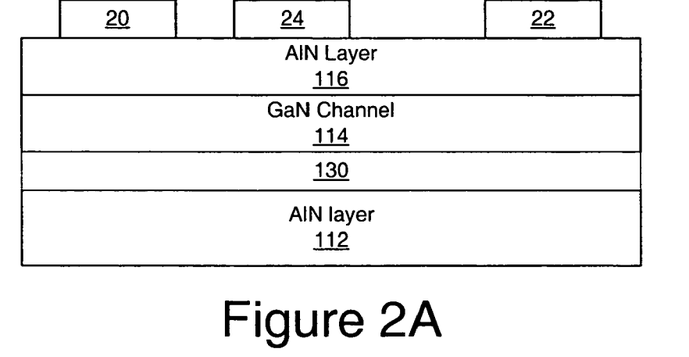
FIGS. 2A and 2B are cross-sections of binary GaN based HEMTs according to some embodiments of the present invention.

FIG. 2A is a schematic diagram of HEMTs according to further embodiments of the present invention. As seen in FIG. 2A, a doped layer 130 is provided on a first AlN barrier layer 112. A GaN channel layer 114 is provided on the doped layer 130. The doped layer 130 may, in some embodiments, be provided as a doped AlN layer, a doped GaN layer and/or a delta-doped layer of, for example, Si, Ge and/or Sn, at the interface between the GaN channel layer 114 and the AlN barrier layer 112. The doped layer 130, for example a delta-doped layer, may provide a sheet charge density of from about $1 \times 10^{12}$ cm$^{-2}$ to about $1 \times 10^{14}$ cm$^{-2}$. A second AlN barrier layer 116 is provided on the GaN channel layer 114. The first AlN barrier layer 112 may be provided as described above with reference to the first barrier layer 12. The GaN layer 114 may be provided as described above with reference to the channel layer 14. The second AlN barrier layer 116 may be provided as described above with reference to the second barrier layer 116. Source and drain ohmic contacts 20 and 22 may be provided on the second barrier layer 116 and a gate contact 24 may be disposed between the source and drain contacts 20 and 22 as described above. Furthermore, the second AlN barrier layer 116 can be made thick if the first AlN barrier layer 112 is substantially relaxed (as in a substrate or thick epitaxial layer) so the GaN channel layer 114 is coherently strained to AlN. This is in contrast to AlN grown on substantially relaxed GaN where the AlN thickness may be limited.

In some embodiments of the present invention, the doped layer 130 may be doped with Si, Ge, and/or Sn and may have a dopant concentration of from about $1 \times 10^{17}$ cm$^{-3}$ to about $1 \times 10^{21}$ cm$^{-3}$. Doping beneath the channel layer 114 may be beneficial for Al polar devices due to band bending in the GaN channel layer 114 making it higher energy. In particular, however the doped layer 130 is provided (e.g., a doped GaN layer or a doped AlN layer), the dopant concentration may be light enough and the doped layer 130 thin enough so that all or substantially all of the electrons transfer to the GaN channel (e.g., no unintentional n-type layer is formed in the doped region) but should be thick enough and doped heavily enough so that the desired amount of charge is present in the channel. In particular embodiments of the present invention, the doped layer 130 may be from about 0.3 nm to about 5 nm thick.

Optionally, a GaN layer 117 may be provided on the second AlN barrier layer 116. The GaN layer 117 may increase the barrier to the surface or modify surface states. The GaN layer 117 may be doped or delta-doped at the GaN/AlN interface to reduce energy barrier to surface and reduce or minimize the effect on 2DEG density and reduce or prevent a 2D hole gas from forming. An optional AlInGaN or graded layer may, instead be provided on the second AlN barrier layer 116 provided the second AiN barrier layer 116 is sufficiently thick such that electrons in the channel do not significantly extend beyond the AlN barrier layer 116.

Figure 2B:
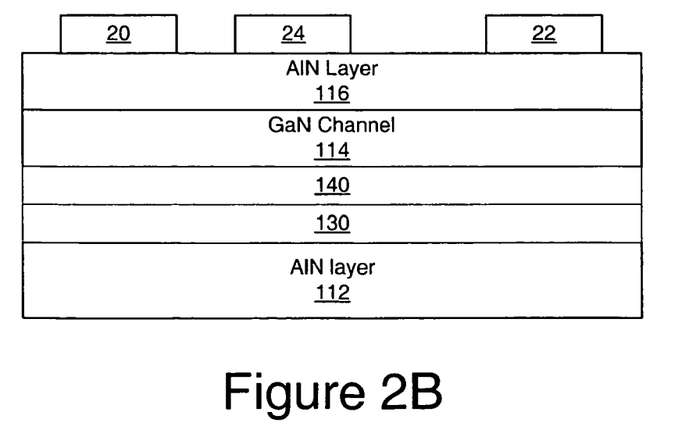

FIG. 2B illustrates further embodiments of the present invention that include an undoped AlN layer 140 may be disposed between the doped layer 130 and the GaN channel layer 114. In some embodiments of the present invention, the undoped AlN layer 140 may be from about 0.3 nm to about 5 nm thick. The undoped AlN layer 140 may space the doped layer 130 from the channel layer 114 to reduce and/or minimize ionized impurity scattering.

Figure 4A:
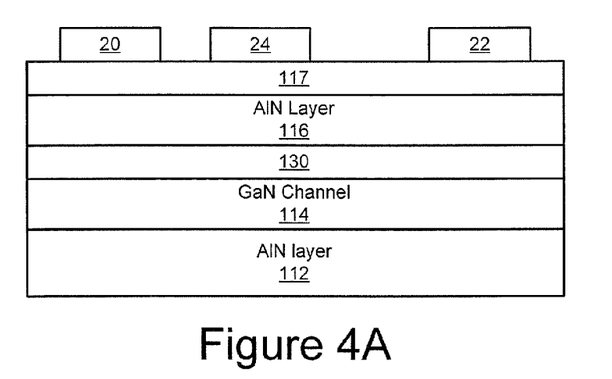
FIGS. 4A and 4B are cross-sections of binary GaN based HEMTs according to some embodiments of the present invention.
Figure 4B:
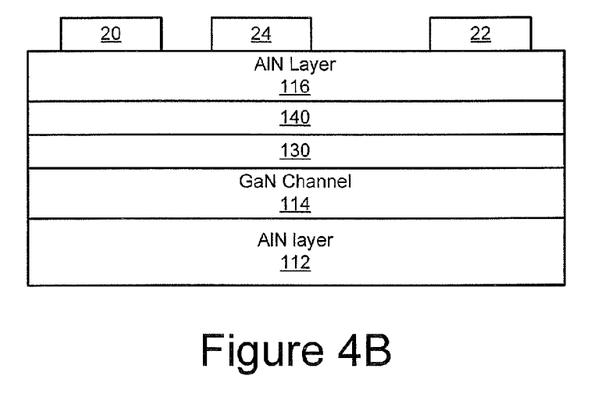
Figure 5:
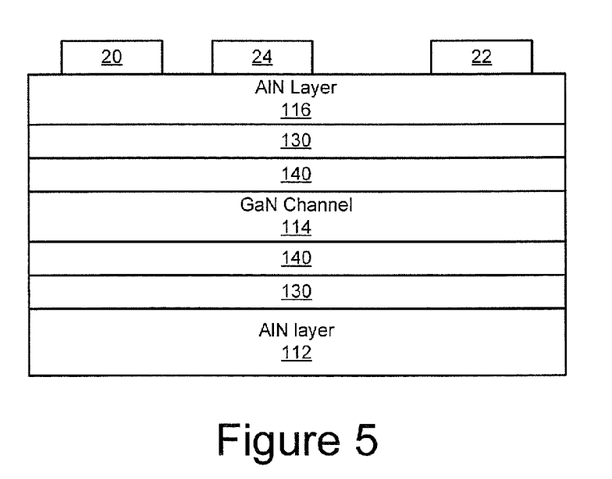
FIG. 5 is a cross-section of binary GaN based HEMTs according to some embodiments of the present invention.

While embodiments of the present invention are illustrated in FIGS. 2A and 2B as including doped and/or undoped layers on one side of the channel layer 114, doped and/or undoped layers may also be included on the other side of the channel layer 114 as illustrated in Figures 4A and 4B or both sides of the channel layer 114 as illustrated in Figure 5. Such layers may be provided as described above with reference to FIGS. 2A and 2B.

A passivation layer (not shown) may also be provided on the structures of FIGS. 1, 2A and 2B. In certain embodiments of the present invention, the passivation layer may be silicon nitride, silicon dioxide, an ONO structure and/or an oxynitride. Furthermore, the passivation layer may be a single or multiple layers of uniform and/or non-uniform composition. Such passivation layer, however, may be unnecessary in light of the robustness of AlN as the outermost layer of the device.

Embodiments of the present invention utilizing AlN as the second barrier layer at the surface may have a chemically robust surface and may be substantially relaxed in strain if the first barrier layer is also substantially relaxed as for a substrate or thick epitaxial layer. Thus, the AlN second barrier layer may be grown to relatively large thicknesses provided the GaN channel layer is grown coherently. A GaN layer sandwiched between two AlN layers may have a high electric field resulting in a large barrier to electrons entering the first AlN barrier layer assuming Al polar material. AlN substrates typically have a higher thermal conductivity than GaN and low dislocation density. AlN buffer layers are expected to have substantially different trap levels than GaN buffers, possibly resulting in improved reliability.

FIGS. 3A through 3H are graphs of carrier concentration and band diagrams from simulation models of transistors according to some embodiments of the present invention. In the simulations reflected in FIGS. 3A through 3H, the binary Group III-nitrides are idealized and are modeled as having no impurities other than dopants. These simulations are not meant to be exact but are provided to illustrate possible trends and to estimate properties of different designs. Accordingly, these graphs are provided as a rough estimate of possible characteristics of the modeled device structures but are only as accurate as the underlying assumptions and models. Accordingly, the properties of actual devices may differ from those illustrated in FIGS. 3A through 3H.

Figure 3A:
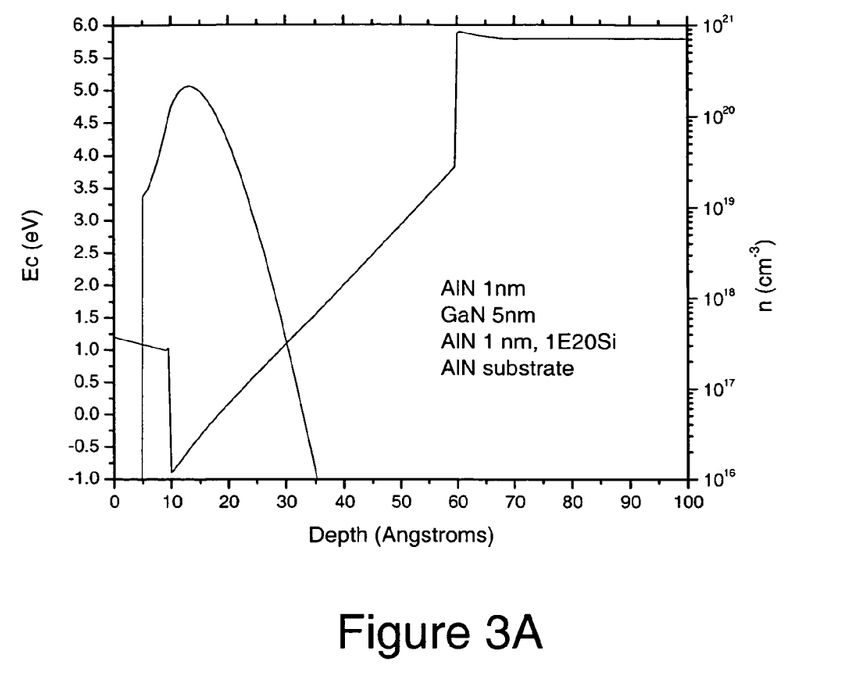
FIGS. 3A through 3H are graphs of carrier concentration and band diagrams from simulation models of transistors according to some embodiments of the present invention.
Figure 3B:
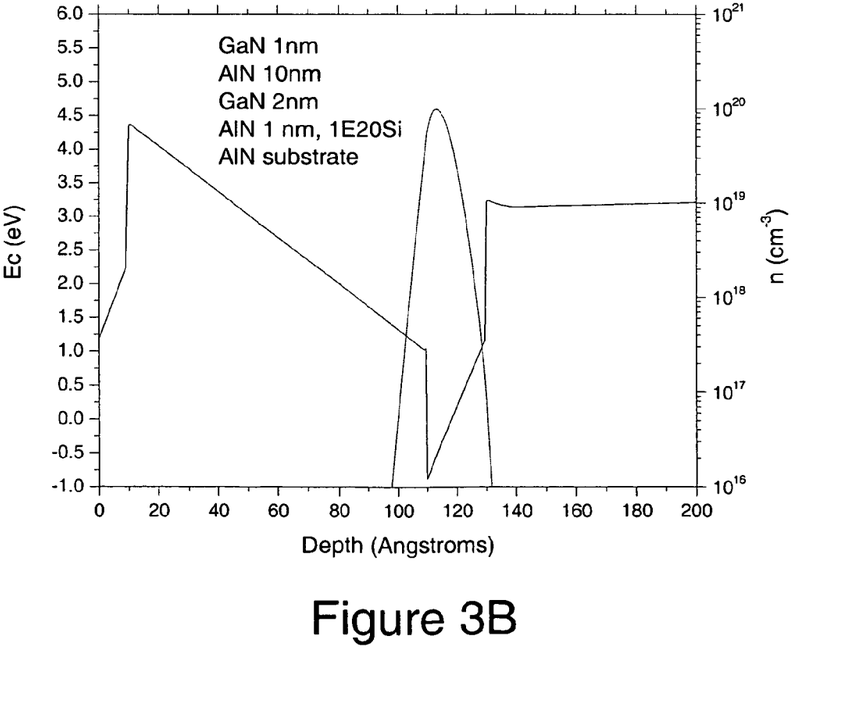

FIG. 3A illustrates a modeled band diagram and electron concentration for a binary Group III-nitride HEMT with an AlN substrate, a 1 nm thick AlN layer doped with Si with a dopant concentration of $1 \times 10^{20}$ cm$^{-3}$ between the substrate and the channel layer, a 20 nm thick GaN channel layer and a 1 nm thick AlN layer. FIG. 3B illustrates a modeled band diagram and electron concentration for a binary Group III-nitride HEMT with an AlN substrate, a 1 nm thick AlN layer doped with Si with a dopant concentration of $1 \times 10^{20}$ cm$^{-3}$ between the substrate and the channel layer, a 2 nm thick GaN channel layer, a 10 nm thick AlN layer and a 1 nm thick GaN layer.

Figure 3C:
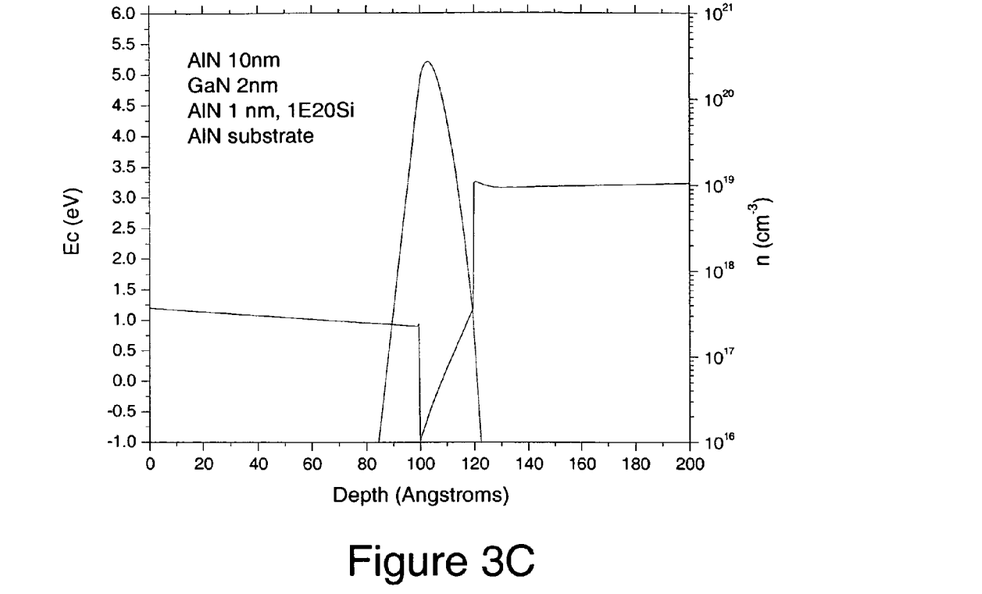

FIG. 3C illustrates a modeled band diagram and electron concentration for a binary Group III-nitride HEMT with an AlN substrate, a 1 nm thick AlN layer doped with Si with a dopant concentration of $1\times10^{20}$ cm$^{-3}$ between the substrate and the channel layer, a 2 nm thick GaN channel layer and a 10 nm thick AlN layer on the channel layer. As seen in FIG. 3C, the configuration of FIG. 3C is predicted to have a higher peak electron concentration than either of the configurations of FIGS. 3A and 3B. FIGS. 3B and 3C illustrate the difference between a GaN cap layer and no GaN cap layer. The GaN cap appears to provide a larger barrier but a lower 2DEG density.

Figure 3D:
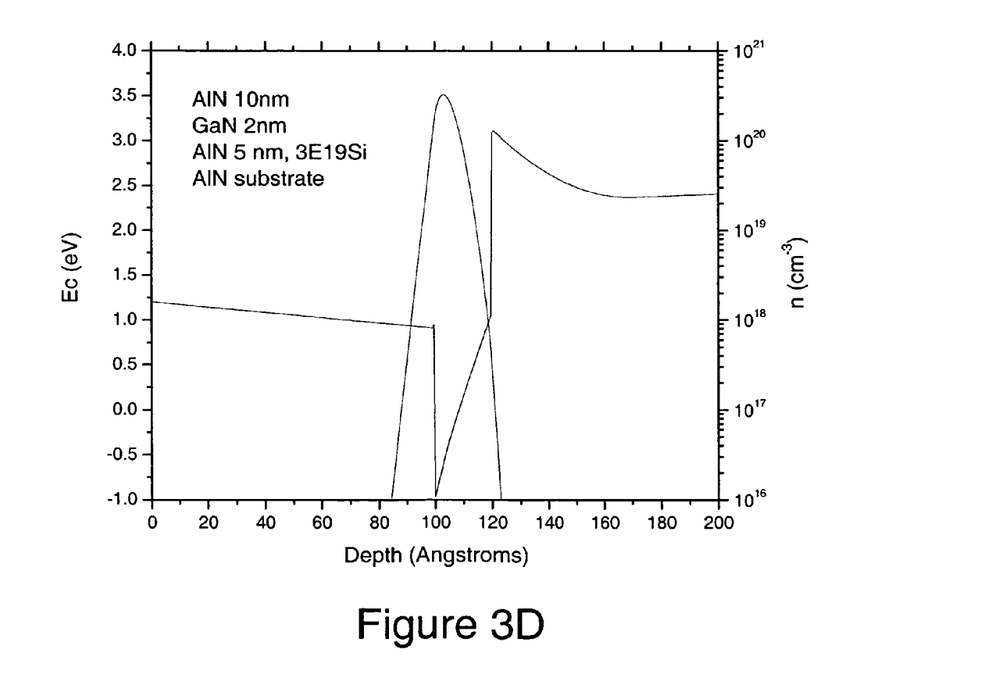

FIG. 3D illustrates a modeled band diagram and electron concentration for a binary Group III-nitride HEMT with an AlN substrate, a 5 nm thick AlN layer doped with Si with a dopant concentration of $3\times10^{19}$ cm$^{-3}$ between the substrate and the channel layer, a 2 nm thick GaN channel layer and a 10 nm thick AlN layer on the channel layer. As seen in FIG. 3D, the configuration of FIG. 3D is predicted to have a higher peak electron concentration than either of the configurations of FIGS. 3A and 3B and about the same or slightly higher than the peak electron concentration predicted for the structure of FIG. 3C but more band bending that the structure of FIG. 3C in the bottom AlN.

Figure 3E:
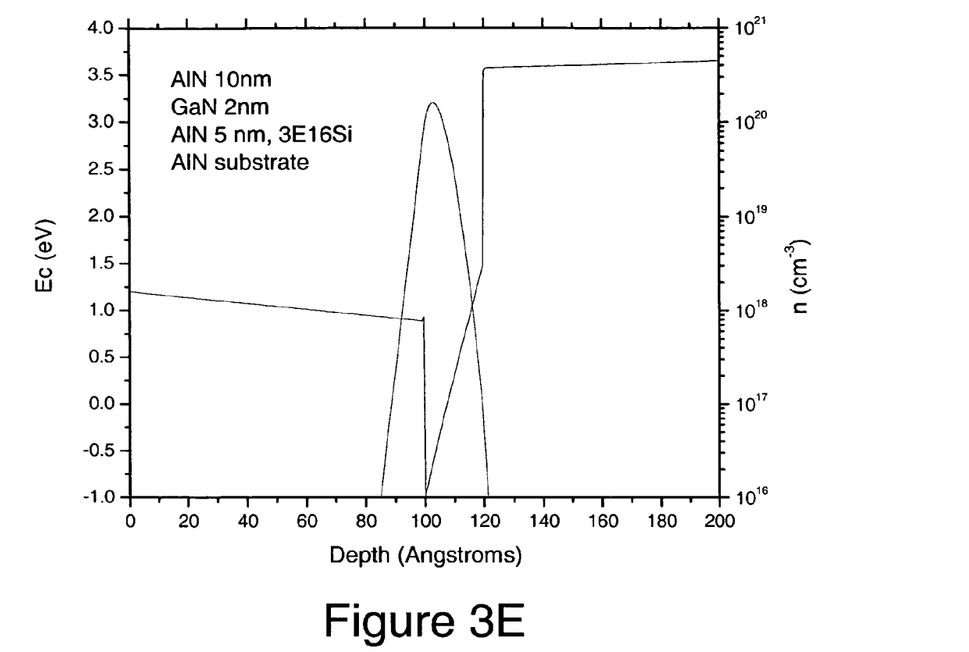

FIG. 3E illustrates a modeled band diagram and electron concentration for a binary Group III-nitride HEMT with an AlN substrate, a 5 nm thick AlN layer doped with Si with a dopant concentration of $3\times10^{16}$ cm$^{-3}$ between the substrate and the channel layer, a 2 nm thick GaN channel layer and a 10 nm thick AlN layer on the channel layer. As seen in FIG. 3E, the configuration of FIG. 3E is predicted to have a lower peak electron concentration than the configuration of FIG. 3D but less band bending in the bottom AlN.

Figure 3F:
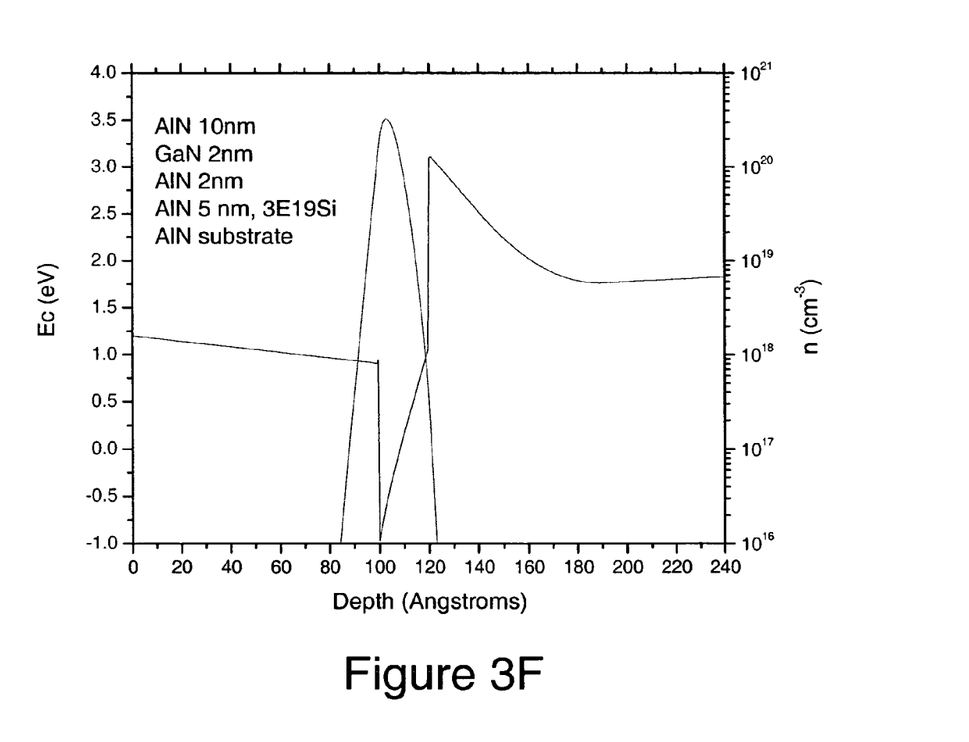

FIG. 3F illustrates a modeled band diagram and electron concentration for a binary Group III-nitride HEMT with an AlN substrate, a 5 nm thick AlN layer doped with Si with a dopant concentration of $3\times10^{19}$ cm$^{-3}$ and a 2 nm thick undoped AlN layer between the substrate and the channel layer, a 2 nm thick GaN channel layer and a 10 nm thick AlN layer on the channel layer. As seen in FIG. 3F, the configuration of FIG. 3F is predicted to have about the same peak electron concentration as the configuration of FIG. 3D but more band bending in the bottom AlGaN.

Figure 3G:
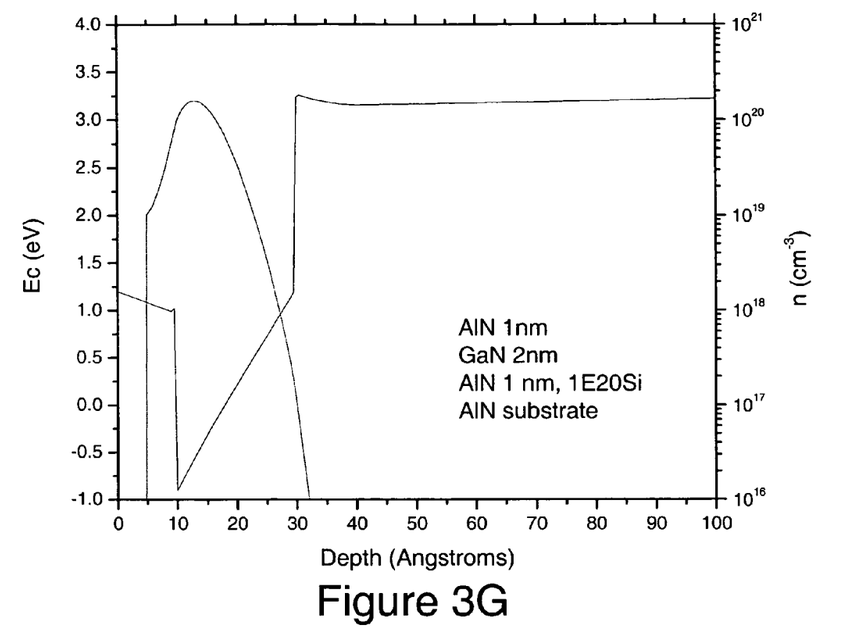

FIG. 3G illustrates a modeled band diagram and electron concentration for a binary Group III-nitride HEMT with an AlN substrate, a 1 nm thick AlN layer doped with Si with a dopant concentration of $1\times10^{20}$ cm$^{-3}$, a 2 nm thick GaN channel layer and a 1 nm thick AlN layer on the channel layer. The structure of FIG. 3G is similar to the structure of FIG. 3A except that it has less band bending due to the thinner GaN layer. The thinner GaN is less likely to lead to the formation of a 2D hole gas at the interface between the first AlN barrier and the GaN channel. While a larger 2DEG is predicted for the thicker GaN layer, a 2D hole gas is predicted for the thicker GaN layer.

Figure 3H:
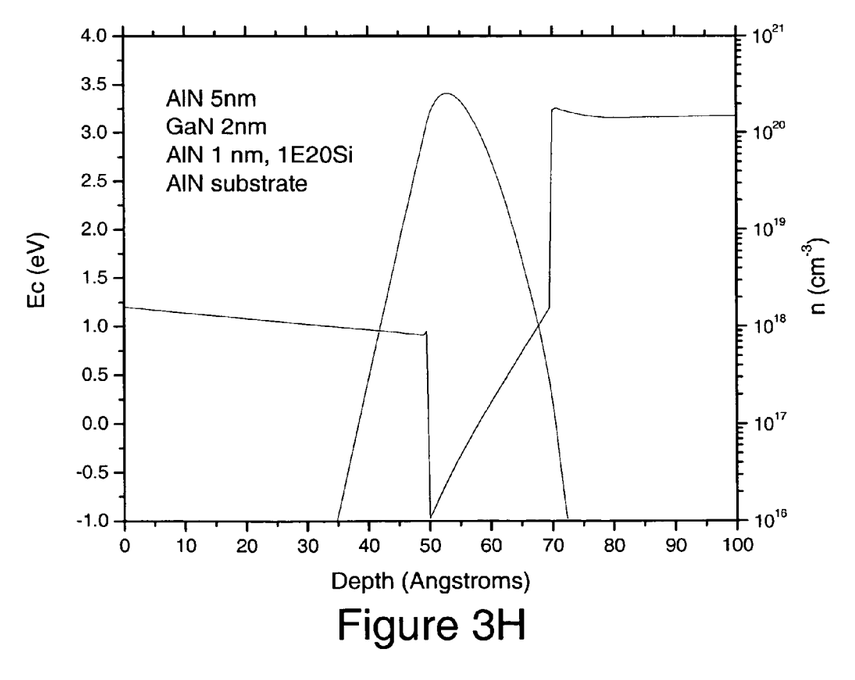

FIG. 3H illustrates a modeled band diagram and electron concentration for a binary Group III-nitride HEMT with an AlN substrate, a 1 nm thick AlN layer doped with Si with a dopant concentration of $1\times10^{20}$ cm$^{-3}$, a 2 nm thick GaN channel layer and a 5 nm thick AlN layer on the channel layer. As seen in FIG. 3G, the configuration of FIG. 3G is predicted to have a slightly lower peak electron concentration than the configuration of FIG. 3H with the thicker AlN barrier layer.

In comparison to the structure of FIG. 3H, the structure of FIG. 3C may provide a slight increase in 2DEG density as the AlN thickness is increased for this model.

Table 1 below is a summary of the characteristics and properties of the structures simulated in FIGS. 3A through 3H.

| Figure | GaN cap thickness (nm) | AlN cap thickness (nm) | GaN channel thickness (nm) | AlN spacer thickness (nm) | doped AlN thickness (nm) | doped AlN density (cm$^{-3}$) | sheet doping density (cm$^{-2}$) | sheet electron density in GaN by model (cm$^{-2}$) |
|---|---|---|---|---|---|---|---|---|
| 3A | 0 | 1 | 5 | 0 | 1 | 1E+20 | 1E+13 | 1.7E+13 |
| 3B | 1 | 10 | 2 | 0 | 1 | 1E+20 | 1E+13 | 7.9E+12 |
| 3C | 0 | 10 | 2 | 0 | 1 | 1E+20 | 1E+13 | 2.1E+13 |
| 3D | 0 | 10 | 2 | 0 | 5 | 3E+19 | 1.5E+13 | 2.6E+13 |
| 3E | 0 | 10 | 2 | 0 | 5 | 3E+16 | 1.5E+10 | 1.2E+13 |
| 3F | 0 | 10 | 2 | 2 | 5 | 3E+19 | 1.5E+13 | 2.6E+13 |
| 3G | 0 | 1 | 2 | 0 | 1 | 1E+20 | 1E+13 | 1.2E+13 |
| 3H | 0 | 5 | 2 | 0 | 1 | 1E+20 | 1E+13 | 2.0E+13 |

In general, a thicker top AlN, higher sheet doping density and no GaN cap are predicted to lead to higher electron density in the GaN channel layer.

While embodiments of the present invention have been described herein with reference to particular HEMT structures, the present invention should not be construed as limited to such structures. For example, additional layers may be included in the HEMT device while still benefiting from the teachings of the present invention. In some embodiments, insulating layers such as SiN or an ONO structure may be deposited for making a MISHEMT and/or passivating the surface. The additional layers may also include a compositionally graded transition layer or layers.

Also, other structures, such as recessed or "T" gate structures, regrown contact regions or the like may also be provided. Accordingly, some embodiments of the present invention provide binary Group III-nitride embodiments of structures such as those described in, for example, U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. Pat. No. 6,849,882 to Smorchkova et al., entitled "GROUP-III NITRIDE BASED HIGH ELECTRON MOBILITY TRANSISTOR (HEMT) WITH BARRIER/ SPACER LAYER", U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," U.S. patent application Ser. No. 10/772,882 filed Feb. 5, 2004 for "NITRIDE HETEROJUNCTION TRANSISTORS HAV- ING CHARGE-TRANSFER INDUCED ENERGY BARRIERS AND METHODS OF FABRICATING THE SAME," U.S. patent application Ser. No. 10/897,726, filed Jul. 23, 2004 entitled "METHODS OF FABRICATING NITRIDE-BASED TRANSISTORS WITH A CAP LAYER AND A RECESSED GATE," U.S. patent application Ser. No. 10/849,617, filed May 20, 2004 entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS," U.S. patent application Ser. No. 10/849,589, filed May 20, 2004 and entitled "SEMICONDUCTOR DEVICES HAVING A HYBRID CHANNEL LAYER, CURRENT APERTURE TRANSISTORS AND METHODS OF FABRICATING SAME," U.S. Patent Publication No. 2003/0020092 filed Jul. 23, 2002 and published Jan. 30, 2003 for "INSULATING GATE ALGAN/GAN HEMT", U.S. patent application Ser. No.10/996,249, filed Nov. 23, 2004 and entitled "CAP LAYERS AND/OR PASSIVATION LAYERS FOR NITRIDE-BASED TRANSISTORS, TRANSISTOR STRUCTURES AND METHODS OF FABRICATING SAME," U.S. patent application Ser. No. 11/080,905, filed Mar. 15, 2005 and entitled "GROUP III NITRIDE FIELD EFFECT TRANSISTORS (FETs) CAPABLE OF WITHSTANDING HIGH TEMPERATURE REVERSE BIAS TEST CONDITIONS," U.S. patent application Ser. No. 11/005,107, filed Dec. 6, 2004 and entitled "HIGH POWER DENSITY AND/OR LINEARITY TRANSISTORS," and U.S. patent application Ser. No. 11/005,423, filed Dec. 6, 2004 and entitled "FIELD EFFECT TRANSISTORS (FETs) HAVING MULTI-WATT OUTPUT POWER AT MILLIMETER-WAVE FREQUENCIES," the disclosures of which are incorporated herein as if described in their entirety. Embodiments of the present invention may also be utilized with HEMT structures such as described in, for example, Yu et al., "Schottky barrier engineering in III-V nitrides via the piezoelectric effect," Applied Physics Letters, Vol. 73, No. 13, 1998, or in U.S. Pat. No. 6,584,333 filed Jul. 12, 2001, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A high electron mobility transistor (HEMT), comprising:
   a first binary Group III-nitride barrier layer;
   a binary Group III-nitride channel layer on the first barrier layer;
   a second binary Group III-nitride barrier layer on the channel layer, wherein the first barrier layer comprises a doped binary Group III-nitride region; and
   an undoped binary Group III-nitride layer disposed between the doped binary Group III-nitride region and the channel layer.

2. The HEMT of claim 1 wherein the first barrier layer comprises an AlN layer, the channel layer comprises a GaN layer and the second barrier layer comprises an AlN layer.

3. The HEMT of claim 2, wherein the first barrier layer has a thickness of from about 1 nm to about 1 mm, the channel layer has a thickness of from about 0.3 nm to about 10 nm and the second barrier layer has a thickness of from about 0.5 nm to about 50 nm.

4. The HEMT of claim 2, further comprising a GaN layer on the second AlN barrier layer opposite the GaN channel layer.

5. The HEMT of claim 4, wherein the GaN layer on the second AlN barrier layer opposite the GaN channel layer has a thickness of from about 0.3 nm to about 10 nm.

6. The HEMT of claim 4, wherein the GaN layer on the second AlN barrier layer opposite the GaN channel layer is doped or delta doped at an interface between the GaN layer and the second AlN barrier layer.

7. The HEMT of claim 1, wherein the first binary Group III-nitride barrier layer comprises AlN, the binary Group III-nitride channel layer on the first barrier layer comprises InN and the second binary Group III-nitride barrier layer on the channel layer comprises AlN.

8. The HEMT of claim 1, wherein the first binary Group III-nitride barrier layer comprises GaN, the binary Group III-nitride channel layer on the first barrier layer comprises InN and the second binary Group III-nitride barrier layer on the channel layer comprises GaN.

9. The HEMT of claim 1, wherein the first binary Group III-nitride barrier layer comprises GaN, the binary Group III-nitride channel layer on the first barrier layer comprises InN and the second binary Group III-nitride barrier layer on the channel layer comprises AlN.

10. The HEMT of claim 9, wherein GaN, InN and AlN layers are strain balanced.

11. The HEMT of claim 10, further comprising a GaN cap layer on the AlN layer.

12. The HEMT of claim 1, wherein the first binary Group III-nitride barrier layer comprises AlN, the binary Group III-nitride channel layer on the first barrier layer comprises InN and the second binary Group III-nitride barrier layer on the channel layer comprises GaN.

13. The HEMT of claim 1, wherein the HEMT does not include a ternary or quaternary Group III-nitride layer in an active region of the HEMT.

14. A high electron mobility transistor (HEMT), comprising:
   a first binary Group III-nitride barrier layer;
   a binary Group III-nitride channel layer on the first barrier layer; and
   a second binary Group III-nitride barrier layer on the channel layer, wherein the first barrier layer comprises a doped binary Group III-nitride region, wherein the second barrier layer comprises a first doped binary Group III-nitride region on the binary Group III-nitride channel layer opposite the first barrier layer.

15. The HEMT of claim 14, further comprising an undoped binary Group III-nitride layer disposed between the first doped binary Group III-nitride region and the channel layer.

16. A high electron mobility transistor (HEMT). comprising:
   a first binary Group III-nitride barrier layer;
   a binary Group III-nitride channel layer on the first barrier layer;
   a second binary Group III-nitride barrier layer on the channel layer, wherein the second barrier layer comprises a first doped binary Group III-nitride region on the binary Group III-nitride channel layer opposite the first barrier layer; and
   an undoped binary Group III-nitride layer disposed between the first doped binary Group III-nitride region and the channel layer.

17. A high electron mobility transistor (HEMT), comprising:
 a first binary Group III-nitride barrier layer;
 a binary Group III-nitride channel layer on the first barrier layer;
 a second binary Group III-nitride barrier layer on the channel layer, wherein the first barrier layer comprises an AlN layer, the channel layer comprises a GaN layer and the second barrier layer comprises an AlN layer; and
 a first doped AlN layer disposed between the first AlN barrier layer and the GaN channel layer.

18. The HEMT of claim 17, wherein the first doped AlN layer comprises a Si doped AlN layer.

19. The HEMT of claim 17, wherein the first doped AlN layer has a thickness of from about 0.2 nm to about 10 nm.

20. The HEMT of claim 17, wherein the first doped AlN layer has a dopant concentration of from about $1\times10^{17}$ cm$^{-3}$ to about $1\times10^{21}$ cm$^{-3}$.

21. The HEMT of claim 17, further comprising a first undoped AlN layer disposed between the first doped AlN layer and the GaN channel layer.

22. The HEMT of claim 21, wherein the first undoped AlN layer has a thickness of from about 0.3 nm to about 5 nm.

23. The HEMT of claim 17, further comprising a second doped AlN layer disposed between the second AlN barrier layer and the GaN channel layer.

24. The HEMT of claim 23, wherein the second doped AlN layer comprises a Si doped AlN layer.

25. The HEMT of claim 23, wherein the second doped AlN layer has a thickness of from about 0.2 nm to about 10 nm.

26. The HEMT of claim 23, wherein the second doped AlN layer has a dopant concentration of from about $1\times10^{17}$ cm$^{-3}$ to about $1\times10^{21}$ cm$^{-3}$.

27. The HEMT of claim 23, further comprising a second undoped AlN layer disposed between the second doped AlN layer and the GaN channel layer.

28. The HEMT of claim 27, wherein the second undoped AlN layer has a thickness of from about 0.3 nm to about 5 nm.

29. A high electron mobility transistor (HEMT), comprising:
 a first binary Group III-nitride barrier layer;
 a binary Group III-nitride channel layer on the first barrier layer;
 a second binary Group III-nitride barrier layer on the channel layer, wherein the first barrier layer comprises an AlN layer, the channel layer comprises a GaN layer and the second barrier layer comprises an AlN layer; and
 a doped AlN layer disposed between the second AlN barrier layer and the GaN channel layer.

30. The HEMT of claim 29, wherein the doped AlN layer comprises a Si doped AlN layer.

31. The HEMT of claim 29, wherein the doped AlN layer has a thickness of from about 0.2 mu to about 10 nm.

32. The HEMT of claim 29, wherein the doped AlN layer has a dopant concentration of from about $1\times10^{17}$ cm$^{-3}$ to about $1\times10^{21}$ cm$^{-3}$.

33. The HEMT of claim 29, further comprising an undoped AlN layer disposed between the doped AlN layer and the GaN channel layer.

34. The HEMT of claim 33, wherein the undoped AlN layer has a thickness of from about 0.3 nm to about 5 nm.

* * * * *

UNITED STATES PATENT AND TRADEMARK OFFICE
CERTIFICATE OF CORRECTION

| | |
|---|---|
| PATENT NO. | : 7,544,963 B2 |
| APPLICATION NO. | : 11/118675 |
| DATED | : June 9, 2009 |
| INVENTOR(S) | : Saxler |

It is certified that error appears in the above-identified patent and that said Letters Patent is hereby corrected as shown below:

In the Claims:

Column 14, Claim 31, Line 23: Please correct "mu" to read -- nm --

Signed and Sealed this

Eleventh Day of August, 2009

David J. Kappos
*Director of the United States Patent and Trademark Office*